United States Patent [19]
Patwa et al.

[11] Patent Number: 5,883,423
[45] Date of Patent: *Mar. 16, 1999

[54] DECOUPLING CAPACITOR FOR INTEGRATED CIRCUIT SIGNAL DRIVER

[75] Inventors: Nital Patwa; Jayne Brown-West, both of Plano, Tex.

[73] Assignee: National Semiconductor Corporation, Santa Clara, Calif.

[*] Notice: This patent issued on a continued prosecution application filed under 37 CFR 1.53(d), and is subject to the twenty year patent term provisions of 35 U.S.C. 154(a)(2).

[21] Appl. No.: 606,138

[22] Filed: Feb. 23, 1996

[51] Int. Cl.⁶ .............................. H01L 29/76; H01L 29/00
[52] U.S. Cl. ............................. 257/532; 257/371
[58] Field of Search ..................... 257/369, 371, 257/528, 532, 535; 327/546, 552, 558

[56] References Cited

U.S. PATENT DOCUMENTS

| | | | |
|---|---|---|---|
| 4,849,661 | 7/1989 | Bazes | 327/546 |
| 5,289,025 | 2/1994 | Lee | 257/369 |
| 5,298,797 | 3/1994 | Redl | 327/552 |

*Primary Examiner*—Wael Fahmy
*Attorney, Agent, or Firm*—John L. Maxin

[57] ABSTRACT

A decoupling capacitor for an integrated circuit and method of forming the same. The decoupling capacitor includes a p-channel device having first and second p-type doped diffusion regions, a device channel region therebetween, a device gate overlying the device channel region, and a gate insulator separating the device gate and channel region. The first and second diffusion regions are electrically connected to a positive power supply, and the device gate is electrically connected to a negative power supply. The decoupling capacitor may be formed proximate a signal driver in the integrated circuit. The decoupling capacitor may be formed without additional, expensive semiconductor fabrication steps and operates to minimize noise in the circuit.

24 Claims, 10 Drawing Sheets

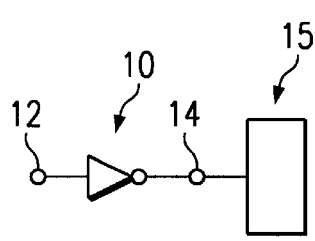
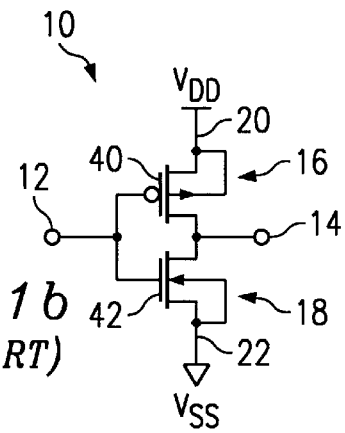
FIG. 1a (PRIOR ART)
FIG. 1b (PRIOR ART)
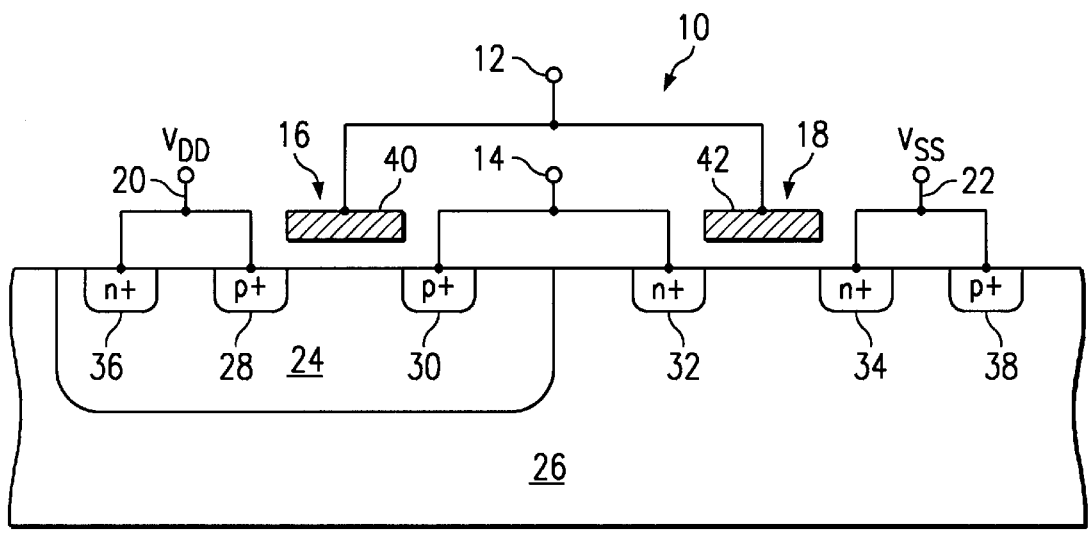
FIG. 1c (PRIOR ART)
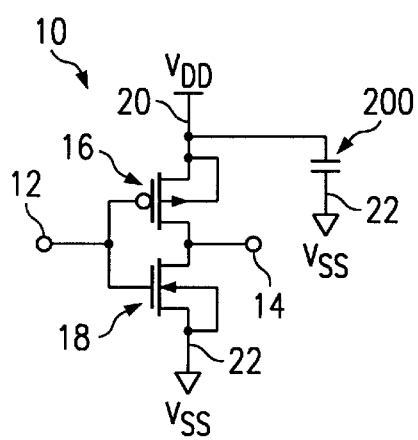
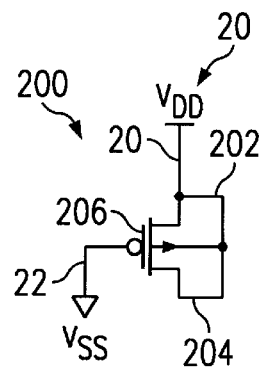
FIG. 2a
FIG. 2b

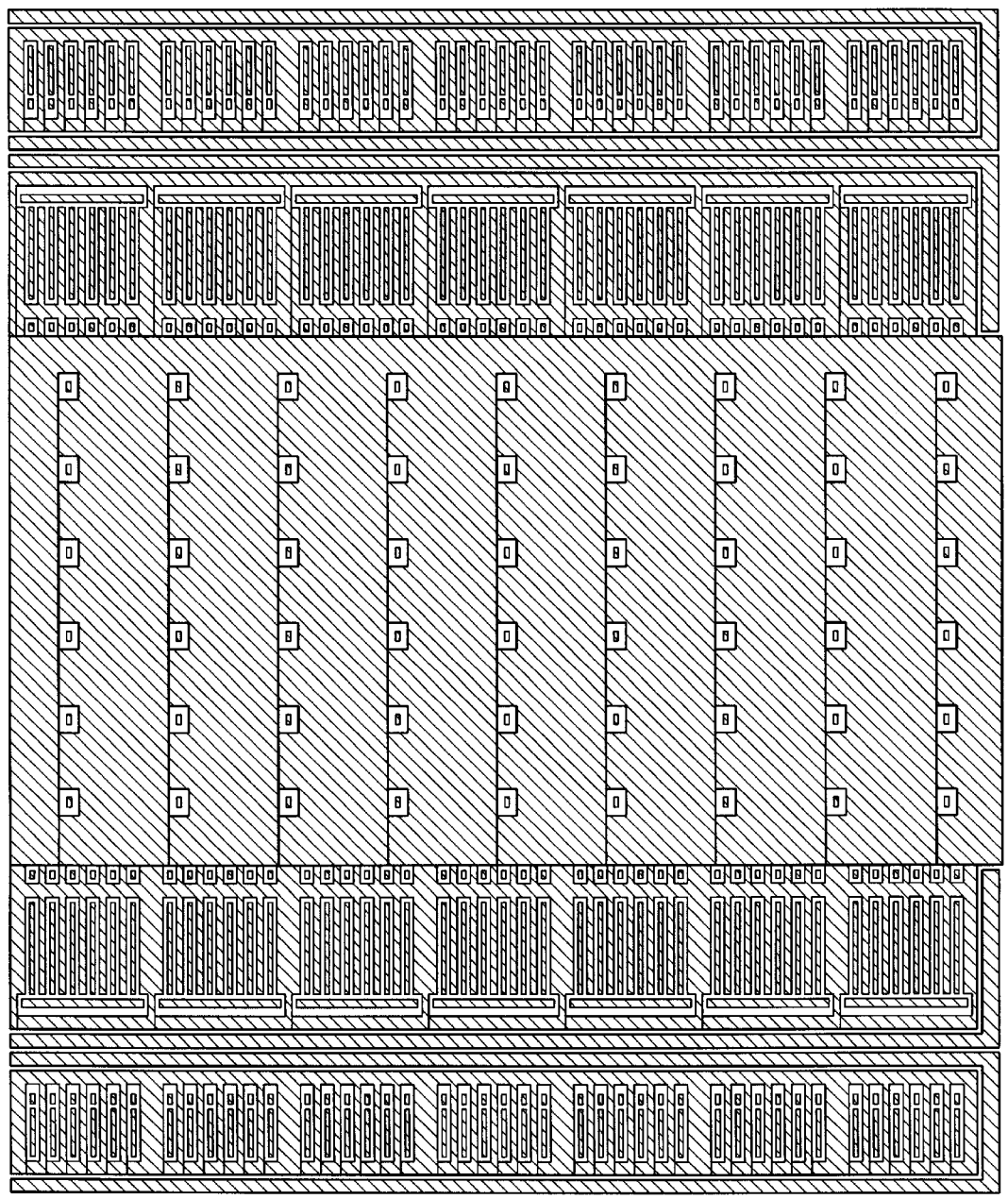
FIG. 7
 332

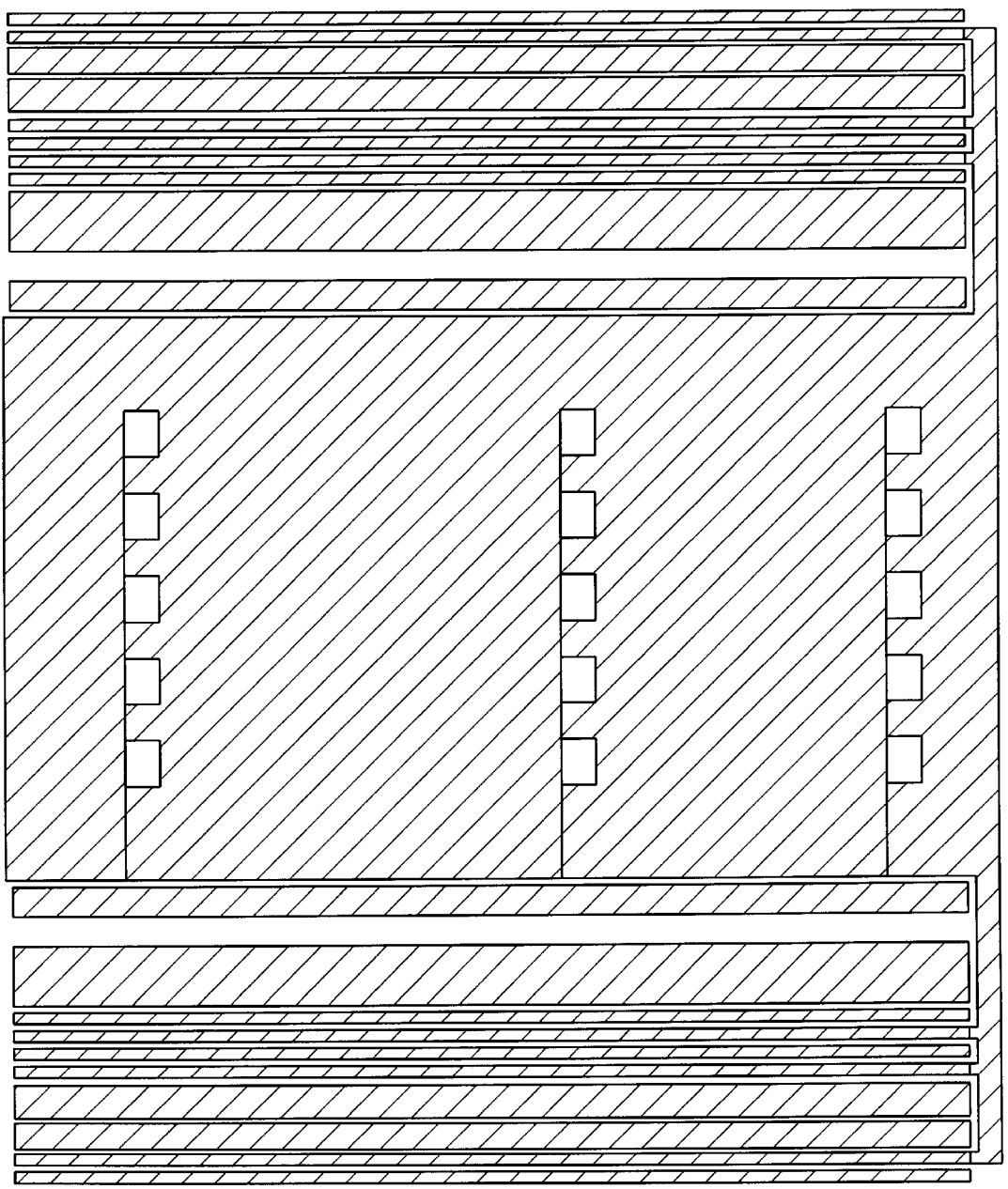
   336

DECOUPLING CAPACITOR FOR INTEGRATED CIRCUIT SIGNAL DRIVER

FIELD OF THE INVENTION

This invention relates generally to integrated circuits, and more particularly to a decoupling capacitor within an integrated circuit.

BACKGROUND OF THE INVENTION

As technological development progresses, modem electronic integrated circuits become increasingly more complex and powerful, they operate at higher speeds, and they consume more electrical power. Along with these developments, the problem of noise within the integrated circuit has become a more significant problem. It is well known in the art that this noise can arise due to parasitic inductances, resistances, and capacitances within the integrated circuit.

Many modem integrated circuits utilize internal clock timing signals to provide a synchronous operation. Examples of high density, high speed clocked logic circuits include microprocessors, microcomputers, math co-processors and the like; of course, other simpler circuits such as memories and smaller scale logic circuits may also be governed by clock timing signals.

Typically, these integrated circuits include a clock driver circuit which is used to provide the internal timing signals throughout the integrated circuit to control its synchronous operation. The internal timing signals coordinate some, if not all, functions within the integrated circuit. The clock driver circuit is, therefore, an important part of the integrated circuit. The following discussion centers upon the use of a clock driver circuit within a microprocessor integrated circuit. However, this discussion is equally applicable to other signal driver circuitry used in all types of integrated circuits, such as address driver circuits, data bus driver circuits, or any other conventional signal driver circuit.

In a microprocessor integrated circuit, the clock driver circuitry is used to drive the internal clock signal to any internal microprocessor circuitry that requires the clock signal to coordinate its operation with other functional elements of the microprocessor. As a result, the clock driver circuit is required to drive the clock signal throughout the microprocessor to numerous internal circuits. The cumulation of the relatively long distances that the signal must travel and the large number of transistors it must drive creates a large load on the output of the clock driver circuit. In order to sufficiently drive the clock signal over the large distances and to the large number of transistors, the clock driver circuit transistors must have sufficient strength to drive the large load. Due to the strong transistors in the driver circuit, the transitions of the driver output from one logic level to another requires large instantaneous current sourcing from the power supply. These large instantaneous currents are often referred to as "switching currents" because they occur when the driver is switching from one state to another. These large instantaneous current flows combined with the resistive, inductive, and capacitive parasitics associated with the power supply lines and the driver load, can create large amounts of noise, often referred to as "switching noise", on the supply lines, the clock signal lines, and other signal lines in the microprocessor.

This noise can cause problems in several areas of a microprocessor. For example, the noise voltage induced in the power supply lines and the signal lines is defined by the equation V=IR + Ldi/dt such that voltage (V) is the summation of the product of the supply or signal current and the parasitic resistance (R) of that line with the product of the parasitic inductance (L) of the supply or signal line and the instantaneous change in the current flowing through that line (di/dt). In modern microprocessors with long signal lines and large switching currents, the noise value can be very significant. This noise may be induced in the power supply lines or signal lines and may cause an error in noise sensitive circuitry within the microprocessor. The large instantaneous currents may also cause a momentary voltage drop on the power supply lines or clock signal lines due to the parasitic resistance of those lines. This momentary voltage drop will slow the device operation for the entire microprocessor. In addition, the large instantaneous currents required by the large clock driver transitions may also cause a power supply drop if the power supply cannot source sufficient current to allow the clock driver circuit to drive its load. This in turn may also slow the device operation throughout the microprocessor. The slowing of the device operation within the microprocessor may in turn cause functional errors due to internal or external race conditions between the functional elements of the microprocessor or its external operating environment.

In order to reduce this noise, capacitors, known as decoupling capacitors, are often used to provide a short term current source or sink for the circuitry in an effort to provide a stable power supply. For example, the decoupling capacitors act as a storage device for electrical charge which can provide a short term current source for the circuitry. When the clock driver circuit transitions from one state to another, the decoupling capacitor will provide a short term current source to supplement the integrated circuit power supply in order to meet the instantaneous currents required by the driver circuit. The local current source provided by the decoupling capacitor reduces the amount of instantaneous current required from the main power supply. This reduces the level of instantaneous current flow through the main power supply lines with the large parasitic inductances and resistances, thus reducing the level of any induced noise voltages or voltage drops.

Decoupling capacitors may also be used to filter out high frequency or low frequency noise from signal lines. It is well known in the art that capacitors with a low capacitance value may be used as a high frequency noise filter, and capacitors with a high capacitance value may be used as a low frequency noise filter.

Typically, decoupling capacitors are placed as close as possible to the circuitry so as to increase their effectiveness. For example, in board level circuit designs, the decoupling capacitors are placed next to the individual integrated circuits on the circuit board. In some instances, decoupling capacitors have been placed within the package containing the integrated circuit. However, the optimum placement of decoupling capacitors is in the integrated circuit itself near the circuitry. While the technology exists to manufacture a parallel-plate capacitor in an integrated circuit, the methodology is expensive because it typically requires the addition of semiconductor fabrication processing steps in order to create the capacitor. This methodology requires the parallel-plate capacitor to be isolated from other circuit elements by layers of insulating material. In addition, fabrication steps are necessary in order to deposit and pattern the conductive and insulative layers of materials forming the capacitor parallel plates and the interlevel dielectric insulator.

It is therefore an object of the present invention to provide a decoupling capacitor formed in an integrated circuit.

It is a further object of the present invention to provide such a decoupling capacitor formed in an integrated circuit which does not require the addition of expensive semiconductor fabrication steps.

It is a further object of the present invention to provide such a decoupling capacitor which is formed in close proximity to the circuitry of the integrated circuit so as to obtain the greatest noise reduction possible.

Still other objects and advantages of the present invention will become apparent to those of ordinary skill in the art having references to the following specification together with its drawings.

SUMMARY OF THE INVENTION

The present invention provides a decoupling capacitor for an integrated circuit. The decoupling capacitor includes a p-channel device having first and second p-type doped diffusion regions, a device channel region therebetween, a device gate overlying the device channel region, and a gate insulator separating the device gate and channel region. The first and second diffusion regions are electrically connected to a positive power supply, and the device gate is electrically connected to a negative power supply.

BRIEF DESCRIPTION OF THE DRAWINGS

For a more complete understanding of the present invention, and the advantages thereof, reference is now made to the following descriptions taken in conjunction with the accompanying drawings, in which:

FIG. 1a illustrates a block diagram of a basic clock driver circuit.

FIG. 1b illustrates a schematic of the basic clock driver circuit of FIG. 1a.

FIG. 1c illustrates a rudimentary cross-section of the basic clock driver circuit of FIG. 1b.

FIG. 2a illustrates a schematic of the basic clock driver circuit of FIG. 1b with a decoupling capacitor according to the preferred embodiments of the present invention.

FIG. 2b illustrates a schematic of a decoupling capacitor using a p-channel device according to a first preferred embodiment of the present invention.

FIG. 3b illustrates a top level view of selected layers of a VLSI CMOS layout of the decoupling capacitor of FIG. 3a.

FIG. 3c illustrates a top level view of further selected layers of a VLSI CMOS layout of the decoupling capacitor of FIG. 3a.

FIG. 4 illustrates a rudimentary cross-section of the clock driver circuit of FIG. 1c with the decoupling capacitor of FIG. 3a.

FIG. 6 illustrates a top level view of a polycrystalline silicon layer of a VLSI CMOS layout of the circuit of FIG. 5c with decoupling capacitors of FIG. 3a.

FIG. 7 illustrates a top level view of a first conductive metal layer of a VLSI CMOS layout of the circuit of FIG. 5c with decoupling capacitors of FIG. 3a.

FIG. 8 illustrates a top level view of a second conductive metal layer of a VLSI CMOS layout of the circuit of FIG. 5c with decoupling capacitors of FIG. 3a.

DETAILED DESCRIPTION OF THE PREFERRED EMBODIMENTS

Figure 2C:
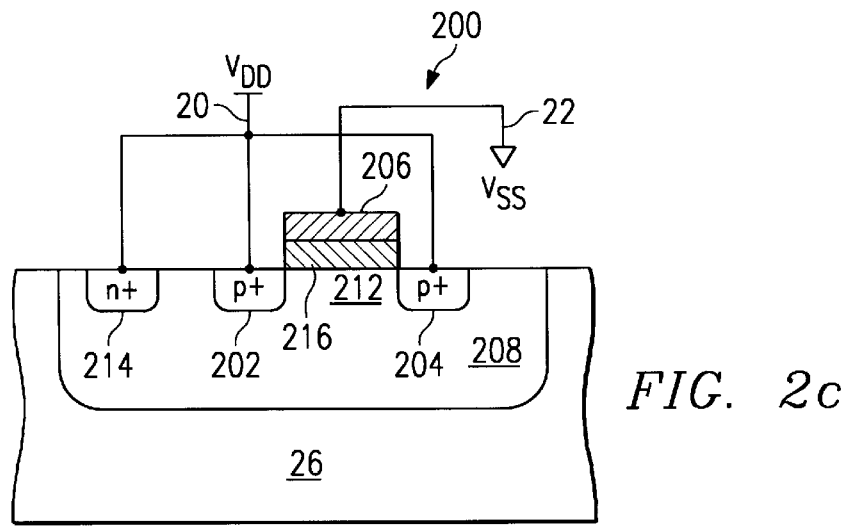
FIG. 2c illustrates rudimentary cross-section of the decoupling capacitor of FIG. 2b.

The preferred embodiments of the present invention and their advantages are best understood by referring to FIGS. 1a through 4 of the drawings, like numerals being used for like and corresponding parts of the various drawings. While the preferred embodiments are described below in connection with a microprocessor, the present invention is fully applicable to any integrated circuit requiring a signal driver circuit for its various functional elements. Similarly, while the preferred embodiments are described below using a clock driver circuit, the present invention is fully applicable with an address driver circuit, a data bus driver circuit, or any other conventional signal driver circuit.

As discussed above, a clock driver circuit is used to provide timing control signals throughout a microprocessor. A basic clock driver circuit 10 is shown in FIG. 1a. The schematic of clock driver circuit 10 is shown in FIG. 1b. As is well known in the art, there are a variety of types of driver circuits. The clock driver circuit 10 shown in FIGS. 1a and 1b is a simple inverter circuit. However, such an inverter circuit is typically incorporated as part of the final stage of any conventional driver circuit. The use of a simple inverter driver circuit for clock driver circuit 10 is for clarity of illustration only and does not limit the scope of the invention.

Referring to FIG. 1a, a clock signal (not shown) is transmitted to a clock driver circuit input 12. The inverted clock signal is transmitted from clock driver circuit 10 by a clock driver circuit output 14 to a clock driver load 15. Clock driver load 15 is comprised of circuitry (not shown) which receives the clock signal transmitted from clock driver circuit 10. Using conventional VLSI (very large scale integration) CMOS (complimentary metal oxide silicon) process and design techniques which are well known to those experienced in the art, clock driver circuit 10 is composed of two transistors, a p-channel transistor 16 and an n-channel transistor 18, as shown in FIG. 1b. Clock driver input 12 is connected to a p-channel transistor gate 40 and a n-channel transistor gate 42. The source-drain path of p-channel transistor 16 is connected between a positive power supply Vdd 20 and clock driver output 14, and the source-drain path of n-channel transistor 18 is connected between clock driver output 14 and a negative power supply Vss 22 (often referred to as "ground"). In operation, if clock driver input 12 is driven to a low logic level, clock driver output 14 will be forced to a high logic level. If clock driver input 12 is driven to a high logic level, clock driver output 14 will be forced to a low logic level.

FIG. 1c shows a rudimentary cross-section of the implementation of clock driver circuit 10 in a typical semiconductor manufacturing VLSI CMOS n-well process using a p-type doped semiconductor substrate. P-channel transistor 16 is formed in a n-type doped implant well 24, while n-channel transistor 18 is formed in a p-type doped semiconductor substrate 26. P-channel transistor 16 has source and drain diffusion regions 28 and 30 identified with a "P+" to show their doping type. N-channel transistor 18 has source and drain diffusion regions 32 and 34 identified with a "n+" to show their doping type. Standard VLSI CMOS design techniques also use additional diffusion regions in semiconductor substrate 26, often referred to as "guard rings", so as to apply a voltage to those regions to maintain proper semiconductor substrate voltage biasing. In the circuit shown in FIG. 1c, n-type doped implant well 24 is electrically connected to Vdd 20 by a n-type doped diffusion "guard ring" region 36. P-type semiconductor substrate 26 is electrically connected to Vss 22 by a p-type doped diffusion "guard ring" region 38 near n-channel transistor 18.

According to the preferred embodiments of the present invention, a decoupling capacitor 200 is connected between Vdd 20 and Vss 22, and is placed in close proximity to p-channel transistor 16 of clock driver circuit 10, as shown in FIG. 2a. In operation, the greatest instantaneous current sourcing required from positive power supply Vdd 20 is when p-channel transistor 16 is actively charging clock driver load 15. By placing decoupling capacitor 200 in close proximity to p-channel transistor 16, the parasitic resistances and inductances between decoupling capacitor 200 and p-channel transistor 16 are minimized. The minimization of these parasitic elements is desired so as to minimize any noise resulting from the parasitics in order to maximize the effectiveness of decoupling capacitor 200.

FIGS. 2b and 2c illustrate a first preferred embodiment for decoupling capacitor 200. As shown in FIG. 2b, decoupling capacitor 200 is formed as a p-channel device having source and drain p-type doped diffusion regions 202 and 204 electrically connected to Vdd 20 and a P-channel device gate 206 electrically connected to Vss 22. Decoupling capacitor 200 is formed as an enhancement mode p-channel device operating in non-saturated region. FIG. 2c shows a rudimentary cross-section of decoupling capacitor 200 for a typical semiconductor manufacturing VLSI CMOS n-well process using a p-type doped semiconductor substrate. In FIG. 2c, decoupling capacitor 200 is formed in a n-type doped implant well 208 in p-type doped semiconductor substrate 26. A p-channel device channel region 212 beneath p-channel device gate 206 is electrically biased to Vdd by an n-type doped diffusion region 214 which is electrically connected to Vdd 20. P-channel device gate 206 is electrically connected to Vss 22. The voltage differential between Vdd 20 and Vss 22 is greater than the threshold voltage of the p-channel device so that the electric field induced in the p-channel device channel region 212 by the voltage differential between the p-channel device gate 206 and the p-channel device p-type doped diffusion regions 202 and 204 is sufficient to allow electrical conduction between the p-channel device p-type doped diffusion regions 202 and 204. For most modern VLSI CMOS integrated circuits, positive power supply Vdd 20 is typically in the range of 1.8 volts to 5 volts, while negative power supply Vss 22 is typically at 0 volts (or "ground"). As shown in FIG. 2c, decoupling capacitor 200 functions similar to a parallel-plate capacitor because p-channel device gate 206 acts as one plate of the capacitor and p-channel device p-type doped diffusion regions 202 and 204 with p-channel device channel region 212 act as the other plate of the capacitor. A p-channel device gate insulator 216 between p-channel device gate 206 and p-channel device channel region 212 acts as a parallel-plate capacitor dielectric insulator. As discussed above, the formation of conventional parallel-plate capacitors in an integrated circuit requires additional semiconductor fabrication steps to deposit, pattern, and form the capacitor. The embodiment of decoupling capacitor 200 formed as a p-channel device provides the advantage that additional expensive semiconductor fabrication steps are not required to form decoupling capacitor 200. Decoupling capacitor 200 is formed using the semiconductor fabrication steps that are already present in a typical VLSI CMOS semiconductor manufacturing process and are used to form p-channel transistors in integrated circuits.

The capacitance value of decoupling capacitor 200 is primarily comprised of three capacitive components. The first capacitive component of decoupling capacitor 200 is the capacitance between p-channel device gate 206 and p-channel device channel region 212. The second capacitive component of decoupling capacitor 200 is the capacitance between n-type doped implant well 208 and p-type doped substrate 26. The third capacitive component of decoupling capacitor 200 is the capacitance between p-channel device gate 206 and p-channel device p-type doped diffusion regions 202 and 204 plus the capacitance between p-channel device gate 206 and substrate 26.

The capacitive component of decoupling capacitor 200 between p-channel device gate 206 and p-channel device channel region 212 is proportional to the area defined by intersection of p-channel device gate 206 and p-channel device channel region 212, the dielectric constant of the p-channel device gate insulator material ($\epsilon_{ox}$), and the thickness ($t_{ox}$) of p-channel device gate insulator 216. The well known parallel-plate capacitance formula is $C = \text{Area}_{gate/channel} \epsilon_{ox}/t_{ox}$. Consistent with typical VLSI CMOS manufacturing processes, silicon dioxide is preferably used as a device gate insulator material, the dielectric constant of silicon dioxide $\epsilon_{ox}$ is typically on the order of $3.5 \times 10^{-11}$ F/m, and the preferred thickness of the device gate insulator 216 is approximately 50 to 250 Angstroms (1 Angstrom = $1 \times 10^{-10}$ m). In contrast, conventional parallelplate capacitors use an interlevel insulating layer of an integrated circuit as a dielectric insulator, and such interlevel insulating layers typically have a thickness of approximately 1000 to 2000 Angstroms. Therefore, forming decoupling capacitor 200 as a p-channel device also provides an enhanced capacitance value as compared to such conventional capacitors because the thickness of p-channel device gate insulator 216 is very thin compared to such interlevel insulating layers.

The capacitive component of decoupling capacitor 200 between n-type doped implant well 208 and p-type doped substrate 26 is proportional to the surface area interface between implant well 208 and substrate 26. The value of the capacitance of this component does not lend itself to be easily calculated by a formula. Various mathematical models known to those in the art may be used to estimate the capacitance value of this component. In addition, various mathematical models known to those in the art may also be used to calculate the capacitive component of decoupling capacitor 200 between p-channel device gate 206 and p-channel device p-type doped diffusion regions 202 and 204 and the capacitance between p-channel device gate 206 and substrate 26.

Figure 3A:
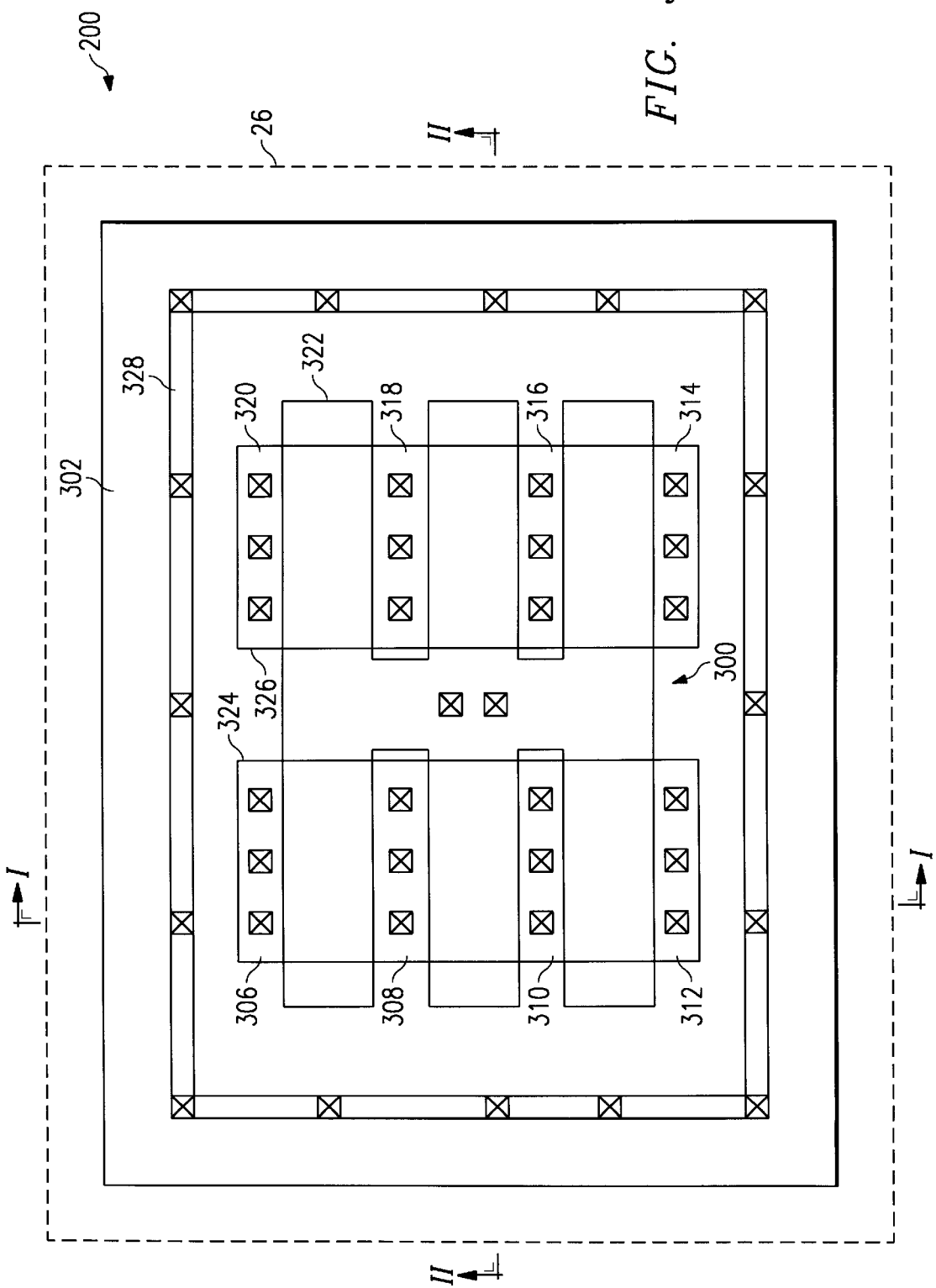
FIG. 3a illustrates atop level view of a VLSI CMOS layout of a decoupling capacitor according to a second preferred embodiment of the present invention.
Figure 3B:
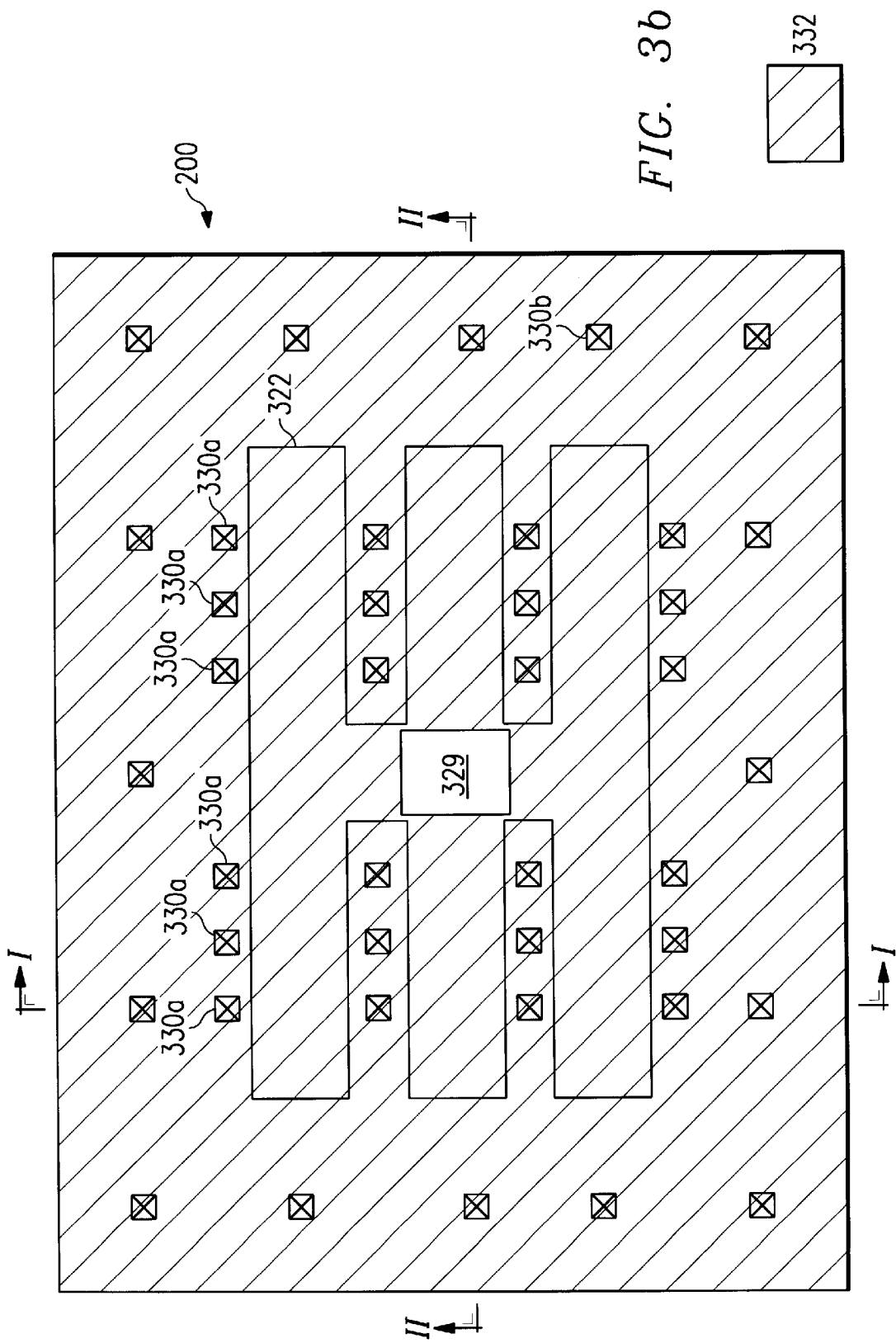
Figure 3C:
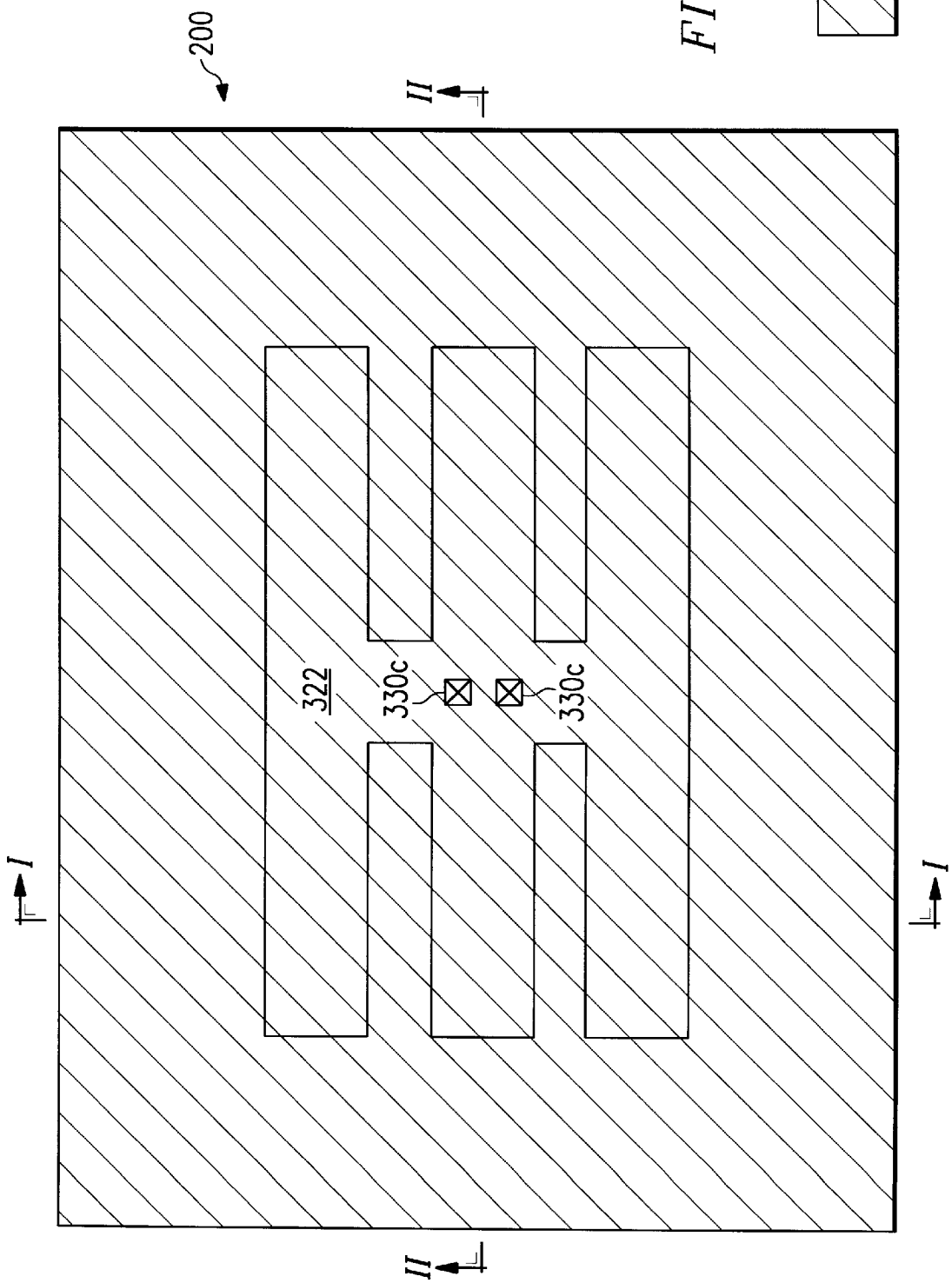
Figure 3D:
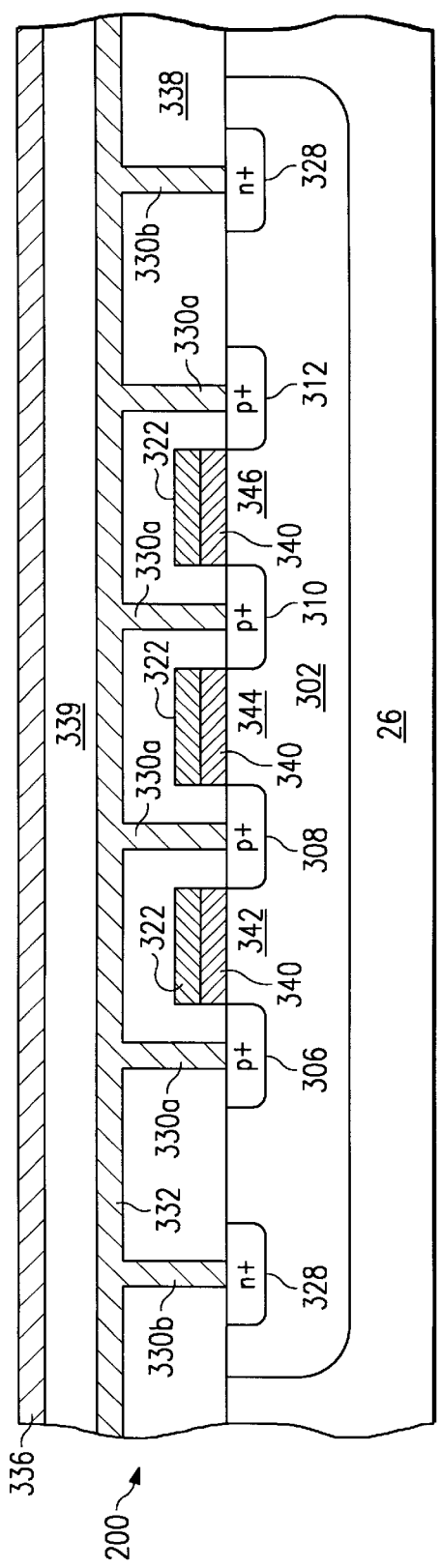
FIG. 3d illustrates a cross-section of an implementation of the decoupling capacitor of FIG. 3a along line I—I.
Figure 3E:
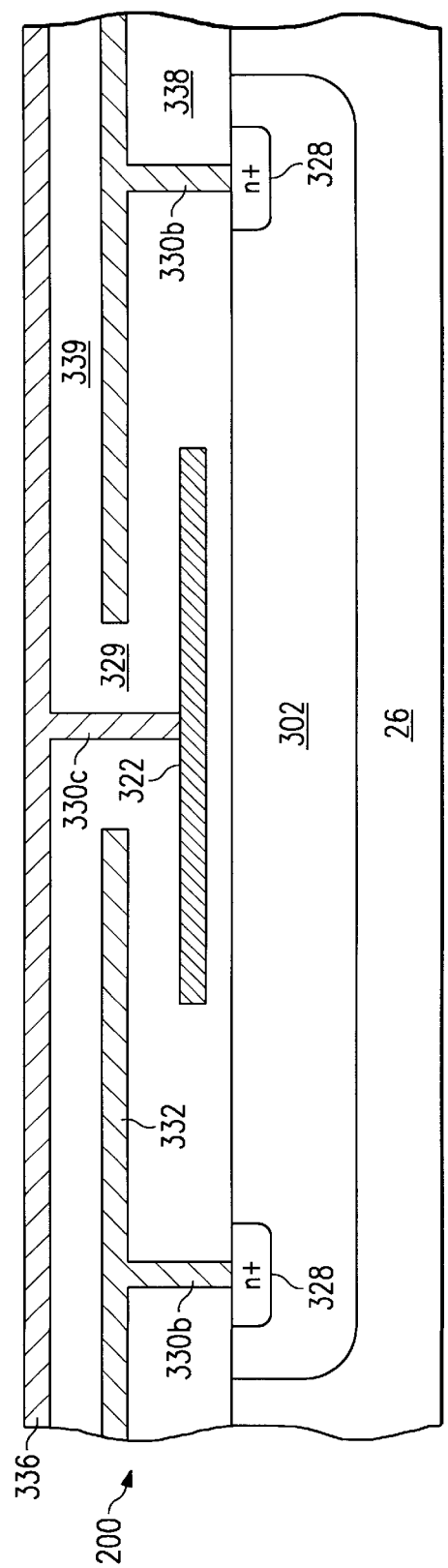
FIG. 3e illustrates a cross-section of an implementation of the decoupling capacitor of FIG. 3a along line II—II.
Figure 4:
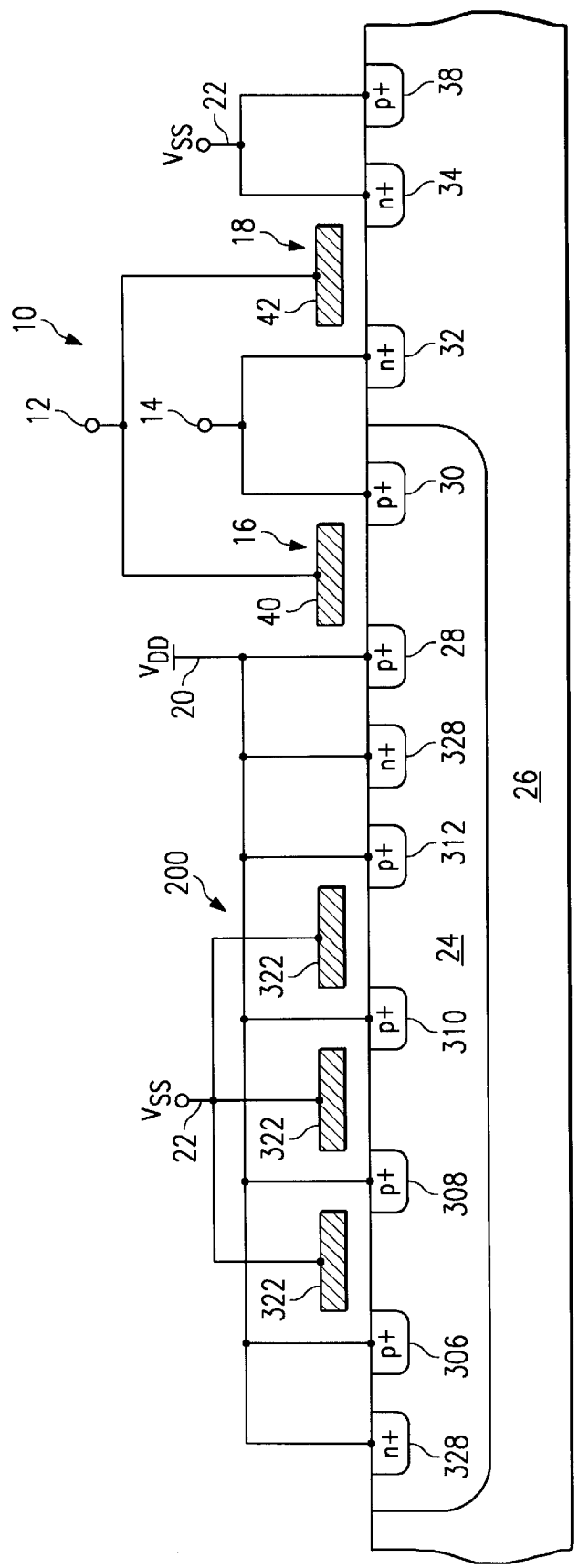

FIGS. 3a through 4 illustrate a second preferred embodiment of decoupling capacitor 200. Referring to FIG. 3a, decoupling capacitor 200 is embodied in a typical semiconductor manufacturing VLSI CMOS n-well process using a p-type doped semiconductor substrate along with a polycrystalline silicon gate layer and multiple interconnecting conductive metal layers which overlie the substrate and gate layers. As used in this document, the terms "metal" or "metal layer" include metals, metal alloys, polycrystalline silicon, or any other conventional conductive material used in the fabrication of the interconnecting lines and layers of an integrated circuit. The semiconductor manufacturing processing steps necessary to form the second preferred embodiment of decoupling capacitor 200 are well known to those in the art, and therefore are not described in detail.

As shown in FIG. 3a, decoupling capacitor 200 is formed using a p-channel device 300 formed in a n-type doped implant well 302 in p-type doped semiconductor substrate 26. P-channel device 300 is composed of multiple p-type doped diffusion regions 306, 308, 310, 312, 314, 316, 318, and 320 as well as multiple p-channel device channel regions. The p-channel device channel regions are defined by the intersection of a p-channel device gate 322 and p-channel device diffusion region boundaries 324 and 326, as is later described in greater detail in connection with FIGS. 3d and 3e. The arrangement of p-type doped diffusion regions 306, 308, 310, 312, 314, 316, 318, and 320, as shown in FIG. 3a, form a preferred array of diffusion regions. Of course, the present invention is fully applicable to similar arrays formed with fewer or more diffusion regions. P-channel device 300 is preferably surrounded by a n-type diffusion "guard ring" 328. P-channel device gate 322, diffusion regions 306 through 320, and guard ring 328 are preferably connected to their respective power supplies by conductive metal layers (not shown in FIG. 3a) and by contact openings in the interlevel insulating layers. The interlevel insulating layers are not shown in FIGS. 3a, 3b, and 3c for clarity of illustration. In addition, these interlevel insulating layers are preferably formed using silicon dioxide, but it is well known in the art that other types of insulating materials may be used as interlevel insulating layers. Contact openings generally refer to openings in the insulative layers to allow inter-connectivity between layers of semiconductor materials and are illustrated in FIGS. 3a, 3b, and 3c as a square box having a "x" therein.

FIG. 3b is a top level view of the VLSI layout of decoupling capacitor 200 showing only p-channel device gate 322, a first conductive metal layer 332, contact openings 330a between p-type doped diffusion regions 306 through 320 and first conductive metal layer 332, and contact openings 330b between guard ring 328 and first conductive metal layer 332. FIG. 3c is a top level view of the VLSI layout of decoupling capacitor 200 showing only p-channel device gate 322, a second conductive metal layer 336, and contact openings 330c between p-channel device gate 322 and second conductive metal layer 336. As shown in FIG. 3b, an opening 329 in first conductive metal layer 332 at the middle of decoupling capacitor 200 allows interconnection between p-channel device gate 322 and second conductive metal layer 336.

FIGS. 3d and 3e show cross-sectional views of the second preferred embodiment of the present invention shown in FIGS. 3a, 3b, and 3c. FIG. 3d is a cross-sectional view along line I—I of FIG. 3a, and FIG. 3e is a cross-sectional view along line II—II of FIG. 3a. In FIG. 3d, p-channel device 300 is formed in n-type doped implant well region 302 in p-type doped semiconductor substrate 26. P-channel device p-type doped diffusion regions 306, 308, 310 and 312 are connected to first conductive metal layer 332 by contact openings 330a in an interlevel insulating layer 338. N-type diffusion "guard ring" 328 is also connected to first conductive metal layer 332 by contact openings 330b in interlevel insulating layer 338. P-channel device gate 322 is insulated from p-channel device channel regions 342, 344, and 346 by p-channel device gate insulator 340. The second conductive metal layer 336 is electrically isolated from first conductive metal layer 332 by an interlevel insulating layer 339. In FIG. 3e, p-channel device gate 322 is connected to second conductive metal layer 336 by contact openings 330c in interlevel insulating layers 338 and 339, and n-type diffusion "guard ring" 328 is connected to first conductive metal layer 332 by contact openings 330b in interlevel insulating layer 338. In the embodiment shown in FIGS. 3a through 3e, first conductive metal layer 332 is electrically connected to positive power supply Vdd 20 (not shown), and second conductive metal layer 336 is electrically connected to negative power supply Vss 22 (not shown).

The second preferred embodiment of FIGS. 3a through 3e is designed so as maximize the capacitance of p-channel device 300 and to minimize the parasitic elements of p-channel device 300 which reduce the effectiveness of decoupling capacitor 200. More specifically, the relative size and orientation of the p-channel device channel regions, such as device channel regions 342, 344, and 346, in relation to p-channel device diffusion regions 306 through 320 and n-type diffusion guard ring 328 was designed so as to maximize the capacitance of p-channel device 300 and minimize the parasitic resistance of diffusion regions 306 through 320, n-type doped implant well region 302, and semiconductor substrate 26. P-channel device diffusion regions 306 through 320 preferably have dimensions in the range of approximately 1 to 4 micrometers by approximately 10 to 20 micrometers. The p-channel device channel regions preferably have dimensions in the range of approximately 1 to 4 micrometers by approximately 10 to 20 micrometers. The use of multiple contact openings 330a to provide interconnectivity between first conductive metal layer 332 and p-channel device p-type doped diffusion regions 306 through 320 also minimizes the parasitic resistance between diffusion regions 306 through 320 and first conductive metal layer 332. The use of multiple contact openings 330b to provide interconnectivity between first conductive metal layer 332 and n-type diffusion guard ring 328 minimizes the parasitic resistances between p-type doped diffusion regions 306 through 320 and n-type diffusion guard ring 328. In addition, the use of a substantially continuous sheet of first conductive metal layer 332 minimizes the parasitic resistances and inductances of the connection between decoupling capacitor 200, clock driver circuit 10 and Vdd 20, and the connection between the p-channel device p-type doped diffusion regions 306 through 320. The use of a substantially continuous sheet of second conductive metal layer 336 to make the connection between p-channel device gate 322 and Vss 22 is also designed to reduce any parasitic resistances or inductances of the interconnection.

Furthermore, decoupling capacitor 200 is preferably implemented in close proximity to clock driver circuit 10. FIG. 4 shows a rudimentary cross-section of clock driver circuit 10 shown in FIG. 1c and the second preferred embodiment of decoupling capacitor 200 illustrated in FIGS. 3a through 3e in such close proximity in a typical semiconductor VLSI CMOS n-well process using a p-type dope semiconductor substrate. As mentioned earlier, the effectiveness of decoupling capacitor 200 is maximized if it is placed in close proximity to p-channel transistor 16 of clock driver circuit 10. The effectiveness of decoupling capacitor 200 is maximized because the parasitic inductance of the interconnection between decoupling capacitor 200 and p-channel transistor 16 is minimized. The effectiveness of decoupling capacitor 200 is also enhanced because the parasitic resistances of the semiconductor substrate 26 and n-type doped implant well 24 between decoupling capacitor 200 and p-channel transistor 16 are minimized by the close proximity between decoupling capacitor 200 and p-channel transistor 16.

In FIG. 4, p-channel transistor 16 and decoupling capacitor 200 are formed in the same n-type doped implant well region 24. N-channel transistor 18 is formed in p-type doped semiconductor substrate 26. Clock driver input 12 is electrically connected to p-channel transistor gate 40 and n-channel transistor gate 42. Clock driver output 14 is electrically connected to p-channel transistor p-type doped diffusion region 30 and n-channel transistor n-type doped diffusion region 32. P-channel transistor p-type doped diffusion region 28 is electrically connected to Vdd 20. N-channel transistor n-type doped diffusion region 34 and p-type doped diffusion "guard ring" region 38 are electrically connected to Vss 22. In decoupling capacitor 200, p-channel device p-type doped diffusion regions 306 through 312 and n-type doped diffusion "guard ring" regions 328 are electrically connected to Vdd 20. P-channel device gate 322 is electrically connected to Vss 22. While FIG. 4 shows the implementation of decoupling capacitor 200 illustrated in FIGS. 3a through 3e in close proximity to clock driver circuit 10, the first preferred embodiment of decoupling capacitor 200 illustrated in FIG. 2c could also be implemented in the same n-type doped implant well region 24 in close proximity to p-channel transistor 16.

Figure 5A:
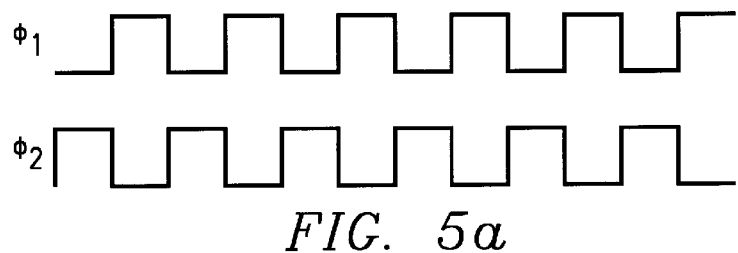
FIG. 5a illustrates two clock signals 180 degrees out of phase with each other.
Figure 5B:
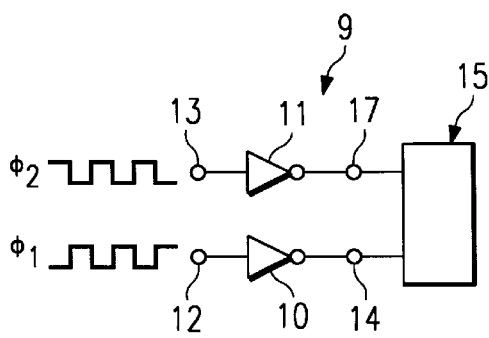
FIG. 5b illustrates a block diagram of a signal driver circuit with two clock driver circuits.

Many modern microprocessors use multiple internal clock signals to control internal functions. For example, a microprocessor may use two clock signals to control its internal functions where each timing signal is 180 degrees out of phase with the other. As illustrated in FIG. 5a, a clock signal phi1 ("$\Phi_1$") is 180 degrees out of phase with a clock signal phi2 ("$\Phi_2$"). The present invention provides an advantage that decoupling capacitor 200 may be placed in close proximity to one or more clock driver circuits. FIG. 5b illustrates a signal driver circuit 9 used to provide two clock signals to clock driver load 15. Clock driver circuit 10 transmits clock signal $\Phi_1$ to clock driver load 15, and a clock driver circuit 11 transmits clock signal $\Phi_2$ to clock driver load 15. Clock signal $\Phi_1$ is transmitted to clock driver circuit input 12 and clock signal $\Phi_2$ is transmitted to a clock driver circuit input 13. The inverted clock signal $\Phi_1$ is transmitted from clock driver 10 by clock driver output 14 to clock driver load 15, and the inverted clock signal $\Phi_2$ is transmitted from clock driver 11 by a clock driver output 17 to clock driver load 15.

Figure 5C:
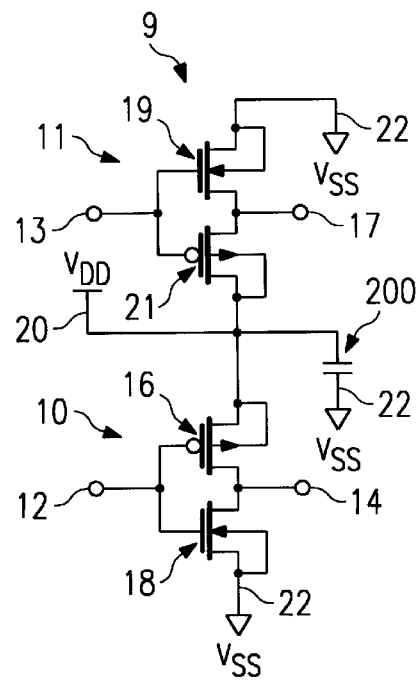
FIG. 5c illustrates a schematic of signal driver circuit of FIG. 5b with a decoupling capacitor according to the preferred embodiments of the present invention.

FIG. 5c illustrates a schematic of signal driver circuit 9 with decoupling capacitor 200 implemented between clock driver circuit 10 and clock driver circuit 11. Clock driver circuit 11 is composed of two transistors, a p-channel transistor 21 and an n-channel transistor 19. Clock driver circuit 11 is identical to clock driver circuit 10 except that p-channel transistor 21 is placed adjacent to decoupling capacitor 200. Decoupling capacitor 200 is placed in between and in close proximity to p-channel transistor 16 and p-channel transistor 21. Since clock signal $\Phi_1$ and clock signal $\Phi_2$ are 180 degrees out of phase with each other, p-channel transistor 16 and p-channel transistor 21 will actively charge clock driver load 15 during different time periods. As a result, decoupling capacitor 200 supplements the instantaneous current sourcing required from positive power supply Vdd 20 for either p-channel transistor 16 or p-channel transistor 21 when each is actively charging clock driver load 15.

Figure 6:
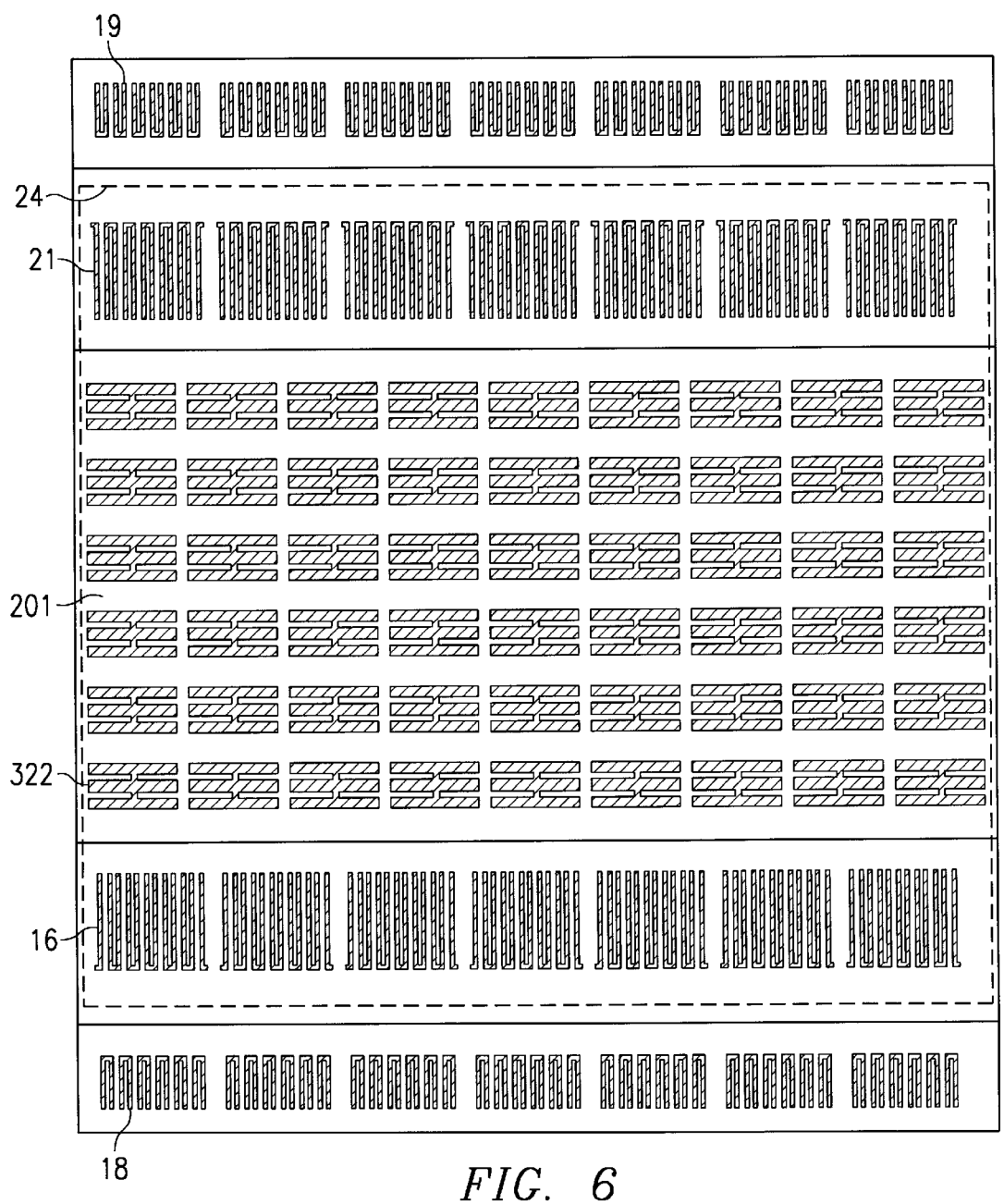
Figure 8:
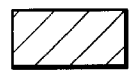

FIGS. 6 through 8 illustrate the implementation of the circuit shown in FIG. 5b with a decoupling capacitor array 201 in close proximity to clock driver circuit 10 and clock driver circuit 11. Decoupling capacitor array 201 is comprised of multiple decoupling capacitors 200 electrically connected in parallel. As is well known in the art, multiple capacitors may be electrically connected in parallel to increase their total capacitance. Referring to FIGS. 6 through 8, decoupling capacitors 200 in decoupling capacitor array 201 are implemented as the second preferred embodiment of decoupling capacitor 200 illustrated in FIG. 3a. Although decoupling capacitor array 201 is the preferred array, the present invention is fully applicable with similar arrays having fewer or more decoupling capacitors. While FIGS. 6 through 8 show decoupling capacitor array 201 using the implementation of decoupling capacitor 200 illustrated in FIGS. 3a through 3e, the first preferred embodiment of decoupling capacitor 200 illustrated in FIG. 2c could also be implemented in decoupling capacitor array 201.

FIG. 6 is a top level view of the VLSI layout showing only the polycrystalline silicon gates of p-channel transistors 16 and 21, the polycrystalline silicon gates of n-channel transistors 18 and 19, and the polycrystalline silicon gates 322 of p-channel devices 300 comprising decoupling capacitor array 201. Decoupling capacitor array 201 is formed in the same n-type doped implant well 24 as p-channel transistor 16 and p-channel transistor 21.

FIG. 7 is a top level view of the VLSI layout showing only first conductive metal layer 332. First conductive metal layer 332 is used to provide interconnection between p-channel transistor 16, p-channel transistor 21, decoupling capacitor array 201, and positive power supply Vdd 20. The use of a substantially continuous sheet of first conductive metal layer 332 to provide this interconnection minimizes the parasitic resistances and inductances of the interconnection so as to enhance the performance of decoupling capacitor array 201.

FIG. 8 is a top level view of the VLSI layout showing only second conductive metal layer 336. Second conductive metal layer 336 is used to provide interconnection between n-channel transistor 18, n-channel transistor 19, decoupling capacitor array 201, and negative power supply Vss 22. The use of a substantially continuous sheet of second conductive metal layer 336 to provide this interconnection also minimizes the parasitic resistances and inductances of the interconnection so as to enhance the performance of decoupling capacitor array 201.

From the above, it may be appreciated that the present invention provides a novel decoupling capacitor which can be implemented directly in the integrated circuit. The invention provides the advantage that it can be implemented in a typical VLSI CMOS manufacturing process without the addition of extra manufacture processing steps. The invention also provides the advantage of allowing the decoupling capacitor to be implemented in close proximity with the electrical circuitry in order to increase the effectiveness of the decoupling capacitor and minimize noise in the integrated circuit.

While the present invention has been described in detail, various alterations, modifications, and substitutions could be made which would not affect the scope of the invention. For example, while the invention has been described in a VLSI CMOS n-well semiconductor manufacturing process, the invention could be implemented in other processes, such as a p-well process using a n-type doped semiconductor substrate or a bipolar process. As another example, the invention could be implemented using different conductive interconnect layers from those illustrated. Consequently, while the invention has been described in connection with what is presently considered to be the most practical and preferred embodiment, it is to be understood that the invention is not limited to the disclosed embodiment and is intended to cover various modifications and equivalent arrangements included within the spirit and scope of the following claims.

What is claimed is:

1. An integrated circuit comprising:
   a semiconductor substrate;
   decoupled circuitry formed in said semiconductor substrate; and,
   an integral decoupling capacitor formed in said semiconductor substrate and disposed in close proximity to a positive and a negative power supply connection of said decoupled circuitry, said integral decoupling capacitor including;
   a first p-type doped diffusion region electrically connected to said positive power supply connection of said decoupled circuitry;
   a second p-type doped diffusion region electrically connected to said positive power supply connection of said decoupled circuitry;
   a channel region disposed between said first and second p-type doped diffusion regions;
   a gate overlying said channel region and electrically connected to said negative power supply connection of said decoupled circuitry; and,
   a gate insulator separating said gate and said channel region.

2. The integrated circuit of claim 1 wherein said semiconductor substrate is a p-type substrate and said integral decoupling capacitor is formed in an n-type doped implant well in said p-type substrate.

3. The integrated circuit of claim 1 wherein said semiconductor substrate is an n-type substrate.

4. The integrated circuit of claim 2 wherein said implant well is electrically connected to said positive power supply connection of said decoupled circuitry.

5. The integrated circuit of claim 1 wherein said decoupled circuitry comprises a signal driver circuit.

6. The integrated circuit of claim 2 wherein said decoupled circuitry has at least one p-channel transistor and wherein said integral decoupling capacitor and said at least one p-channel transistor are formed in said n-type doped implant well.

7. An integrated circuit comprising:
   a semiconductor substrate;
   decoupled circuitry formed in said semiconductor substrate;
   an integral decoupling capacitor formed in said semiconductor substrate and disposed in close proximity to a positive and a negative power supply connection of said decoupled circuitry, said integral decoupling capacitor including;
   a plurality of p-type doped diffusion regions electrically connected to said positive power supply connection of said decoupled circuitry;
   a plurality of channel regions disposed between each of said plurality of p-type doped diffusion regions;
   a gate overlying each of said plurality of channel regions and electrically connected to said negative power supply connection of said decoupled circuitry; and,
   a plurality of gate insulators separating said gate and each of said plurality of channel regions.

8. The integrated circuit of claim 7 wherein said substrate is a p-type substrate and said integral decoupling capacitor is formed in an n-type doped implant well in said p-type substrate.

9. The integrated circuit of claim 7 wherein said substrate is a n-type substrate.

10. The integrated circuit of claim 7 wherein each of said plurality of p-type doped diffusion regions are approximately 1 to 4 micrometers by approximately 10 to 20 micrometers and each of said plurality of channel regions are approximately 1 to 4 micrometers by approximately 10 to 20 micrometers.

11. The integrated circuit of claim 7 wherein said positive power supply connection of said decoupled circuitry and said plurality of p-type doped diffusion regions are electrically connected by a first conductive layer.

12. The integrated circuit of claim 11 wherein said first conductive layer comprises a substantially continuous sheet of conductive material.

13. The integrated circuit of claim 12 wherein said electrical connection between said substantially continuous sheet of conductive material in said first conductive layer and said plurality of p-type doped diffusion regions comprises a plurality of contact openings.

14. The integrated circuit of claim 7 wherein said negative power supply connection of said decoupled circuitry and said gate are electrically connected by a second conductive layer.

15. The integrated circuit of claim 14 wherein said second conductive layer comprises a substantially continuous sheet of conductive material.

16. The integrated circuit of claim 7 further comprising an n-type doped diffusion region encircling said integral decoupling capacitor and electrically connected to said positive power supply connection of said decoupled circuitry.

17. The integrated circuit of claim 7 wherein said decoupled circuitry is a signal driver circuit.

18. The integrated circuit of claim 8 wherein said decoupled circuitry has at least one p-channel transistor and wherein said integral decoupling capacitor and said at least one p-channel transistor are formed in said n-type doped implant well.

19. An integrated circuit comprising:
   a semiconductor substrate;
   decoupled circuitry formed in said semiconductor substrate;
   a plurality of integral decoupling capacitors electrically connected in parallel with each other and disposed in close proximity to a positive and a negative power supply connection of said decoupled circuitry, said plurality of integral decoupling capacitors including;
   a plurality of p-type doped diffusion regions connected to said positive power supply connection of said decoupled circuitry;
   a plurality of channel regions disposed between each of said plurality of p-type doped diffusion regions;
   a gate overlying each of said channel regions connected to said negative power supply connection of said decoupled circuitry; and,
   a plurality of gate insulators separating said gate and each of said plurality of channel regions.

20. The integrated circuit of claim 19 wherein said semiconductor substrate is a p-type substrate and said plurality of integral decoupling capacitors are formed in a n-type doped implant well in said p-type substrate.

21. The integrated circuit of claim 19 wherein said semiconductor substrate is an n-type substrate.

22. The integrated circuit of claim 19 further comprising an n-type doped diffusion region electrically connected to said positive power supply connection of said decoupled circuitry and encircling each of said plurality of integral decoupling capacitors.

23. The integrated circuit of claim 19 wherein said decoupled circuitry is a signal driver circuit.

24. The integrated circuit of claim 20 wherein said decoupled circuitry has at least one p-channel transistor and wherein said plurality of integral decoupling capacitors and said at least one p-channel transistor are formed in said n-type doped implant well.

* * * * *